US012727470B2

(12) United States Patent
Chien et al.

(10) Patent No.: US 12,727,470 B2
(45) Date of Patent: Sep. 1, 2026

(54) SENSING DEVICE AND MANUFACTURING METHOD THEREOF

(71) Applicant: Nuvoton Technology Corporation, Hsinchu Science Park (TW)

(72) Inventors: Chih-Hsuan Chien, Hsinchu Science Park (TW); Kai-Yu Peng, Hsinchu Science Park (TW); Yu-Hsuan Ho, Hsinchu Science Park (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 510 days.

(21) Appl. No.: 18/308,353

(22) Filed: Apr. 27, 2023

(65) Prior Publication Data

US 2024/0274537 A1 Aug. 15, 2024

(30) Foreign Application Priority Data

Feb. 13, 2023 (TW) ................................ 112104897

(51) Int. Cl.
*H10W 20/47* (2026.01)
*H10W 20/00* (2026.01)
*H10W 20/43* (2026.01)

(52) U.S. Cl.
CPC ......... *H10W 20/47* (2026.01); *H10W 20/075* (2026.01); *H10W 20/076* (2026.01); *H10W 20/077* (2026.01); *H10W 20/43* (2026.01)

(58) Field of Classification Search
CPC ............. H01L 23/53295; H01L 23/528; H01L 21/76831; H01L 21/76832;
(Continued)

(56) References Cited

U.S. PATENT DOCUMENTS 6,513,362 B1 2/2003 Yadav et al.
2014/0105790 A1* 4/2014 Gaudon ................ G01N 27/16 422/90
(Continued)

FOREIGN PATENT DOCUMENTS

TW 201616127 A 5/2016
TW 201830657 A 8/2018

OTHER PUBLICATIONS

Office Action mailed Oct. 4, 2023 in corresponding TW Application 112104897, 6 pages.

*Primary Examiner* — John M Parker
(74) *Attorney, Agent, or Firm* — MUNCY, GEISSLER, OLDS & LOWE, P.C.

(57) ABSTRACT

A sensing device and a manufacturing method thereof are provided. The sensing device includes a substrate, a first electrode layer, a first sensing layer, a first dielectric layer, a second electrode layer, a second sensing layer, a second dielectric layer, and a capping layer. The first electrode layer is disposed on the substrate. The first sensing layer is disposed on the first electrode layer and has a plurality of holes. The first dielectric layer is disposed on the first sensing layer. The second electrode layer is disposed on the first dielectric layer. The second sensing layer is disposed on the second electrode layer. A material of the second sensing layer is different from a material of the first sensing layer. The second dielectric layer is disposed on the second sensing layer. The capping layer is disposed on the substrate.

20 Claims, 10 Drawing Sheets

(58) Field of Classification Search
CPC ........... H01L 21/76834; H10W 20/43; H10W 20/47; H10W 20/072; H10W 20/077; H10W 20/076; H10W 20/075
See application file for complete search history.

(56) References Cited

U.S. PATENT DOCUMENTS

| | | | | |
|---|---|---|---|---|
| 2016/0024688 | A1* | 1/2016 | Richardson | C30B 19/00 117/64 |
| 2020/0170149 | A1* | 5/2020 | Kim | G01K 7/22 |
| 2022/0155247 | A1* | 5/2022 | Park | C01G 19/02 |

* cited by examiner

SENSING DEVICE AND MANUFACTURING METHOD THEREOF

CROSS REFERENCE TO RELATED APPLICATIONS

This Application claims priority of Taiwan patent application Ser. No. 11/210,4897, filed on Feb. 13, 2023, the entirety of which is incorporated by reference herein.

BACKGROUND OF THE INVENTION

Field of the Invention

The present disclosure relates to a sensing device and a manufacturing method thereof, and, in particular, to a stacked sensing device and a manufacturing method thereof.

Description of the Related Art

A sensor array operates by using a plurality of sensors simultaneously. Each of the sensors can have different sensing properties, designed to meet specific sensing requirements. Sensor array is often used to distinguish the composition of gasses.

However, a sensing array often takes up a large surface area. Therefore, the sensing array is limited by the installation space, and it cannot be implemented in various applications. For example, a plurality of sensors in a sensing array need to be arranged adjacently on the same plane, so that each sensor can be in contact with the gas to be measured, and in such a way that interference between the sensors can be avoided. Therefore, it is difficult to reduce the surface area of such a sensing array. Thus, there is a problem with miniaturizing sensing devices that include a sensing array.

Therefore, although existing sensing devices and manufacturing methods thereof have generally met their intended purposes, they are still not completely satisfactory in all aspects. There are still problems to be overcome regarding the sensing devices and manufacturing methods thereof.

BRIEF SUMMARY OF THE INVENTION

In view of the above problems, some embodiments of the present disclosure include a first sensing layer having a plurality of holes and a second sensing layer disposed on the first sensing layer, so that the first sensing layer and the second sensing layer are stacked vertically in the normal direction of the substrate. Therefore, in the present disclosure, the first sensing layer may effectively sense gas through the plurality of holes in the first sensing layer, thereby reducing the overall area of the sensing device, increasing the sensor density, and/or improving the gas resolution.

An embodiment of the present disclosure provides a sensing device. The sensing device includes a substrate, a first electrode layer, a first sensing layer, a first dielectric layer, a second electrode layer, a second sensing layer, a second dielectric layer, and a capping layer. The first electrode layer is disposed on the substrate. The first sensing layer is disposed on the first electrode layer and has a plurality of holes. The first dielectric layer is disposed on the first sensing layer. The second electrode layer is disposed on the first dielectric layer. The second sensing layer is disposed on the second electrode layer. A material of the second sensing layer is different from a material of the first sensing layer. The second dielectric layer is disposed on the second sensing layer. The capping layer is disposed on the substrate.

An embodiment of the present disclosure provides a method of manufacturing a sensing device. The manufacturing method includes providing a substrate. A first electrode layer is formed on the substrate. A first mixture is provided on the first electrode layer. The first mixture includes a first sensing material and first particles dispersed in the first sensing material. A first dielectric layer is formed on the first mixture. A first heat treatment process is performed to remove the first particles in the first mixture so as to form a first sensing layer. A second electrode layer is formed on the first dielectric layer. A second sensing layer is formed on the second electrode layer. A second dielectric layer is formed on the second sensing layer. A capping layer is formed on the substrate.

The sensing device and the manufacturing method thereof of the present disclosure may be applied in several types of sensing apparatus. In order to make the features and advantages of the present disclosure more understand, some embodiments of the present disclosure are listed below in conjunction with the accompanying drawings, and are described in detail as follows.

BRIEF DESCRIPTION OF THE DRAWINGS

With the following detailed description in conjunction with the accompanying drawings, we can better understand the viewpoints of the embodiments of the present disclosure. It should be noted that, according to the standard practice in the industry, the various features are not drawn to scale. In fact, the dimensions of the various features may be arbitrarily increased or reduced for clarity.

DETAILED DESCRIPTION OF THE INVENTION

Figures 1A, 1B:
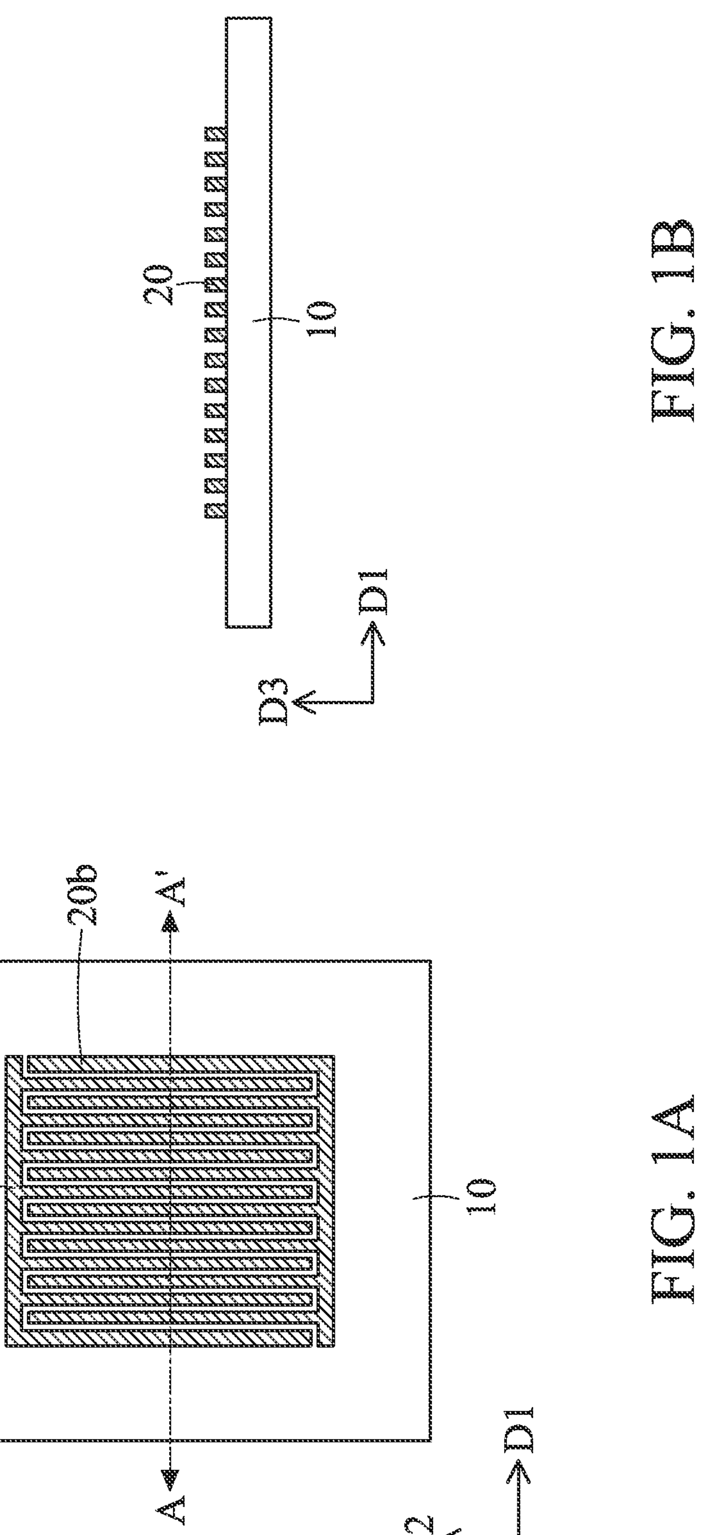
FIG. 1A and FIG. 1B are schematic top view and schematic cross-sectional view of various stages of manufacturing a sensing device according to some embodiments of the present disclosure, respectively.

The following disclosure provides many different embodiments or examples for implementing different features of sensing devices disclosed herein. Specific examples of each feature and its configuration are described below to simplify the embodiments of the present disclosure. Of course, these are examples and are not intended to limit the present disclosure. For example, if the description mentions that the first feature is formed on the second element, it may include an embodiment in which the first feature and second feature are in direct contact, or may include an embodiment in which additional feature is formed between the first feature and the second feature thereby the first feature and the second feature do not directly contact. Furthermore, the embodiments of the present disclosure may repeat reference numerals and/or characters in different examples. This repetition is for brevity and clarity and is not intended to represent a relationship between the different embodiments and/or aspects discussed herein.

Orientation terms discussed herein, such as "on", "over", "below", "under", and the like are only referring to the direction of the drawings. Accordingly, the used orientation terms are intended to illustrate rather than limit the disclosure. In addition, the "first", "second", and the like mentioned in the specification or claims are used to name different elements or distinguish different embodiments or scopes and are not used to limit the upper limit or lower limit of the number of the elements and are not used to limit the manufacturing order or the arrangement order of the elements.

Hereinafter, the terms "about", "substantially", and the like generally mean within 10%, within 5%, within 3%, within 2%, within 1%, or within 0.5% of a given value or range. The given value is an approximate value, that is, "about", "substantially", and the like may still be implied without the specific description of "about", "substantially", and the like.

Unless otherwise defined, all terms (including technical and scientific terms) used herein have the same meaning as commonly understood by a person of ordinary skills in the art. It should be understand that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

It will be appreciated that additional operations may be provided before, during, and after the method, and that some of the described operations may be replaced or deleted for other embodiments of the method.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be perpendicular to each other, or may represent different directions that are not perpendicular to each other.

For convenience of description, hereinafter, the X-axis direction is the first direction D1 (the width direction), the Y-axis direction is the second direction D2 (the length direction), and the Z-axis direction is the third direction D3 (the thickness direction). In an embodiment of the present disclosure, the Z-axis direction is the normal direction of the substrate. In some embodiments, the top view is a view viewed from an XY plane, and the cross-sectional view is a view viewed from an XZ plane.

Referring to FIG. 1A and FIG. 1B, they are schematic top view and schematic cross-sectional view of various stages of manufacturing a sensing device according to some embodiments of the present disclosure, respectively. Wherein, FIG. 1B shows a schematic cross-sectional view taken along the line AA' as shown in FIG. 1A. In addition, subsequent FIG. 2B, FIG. 3B, FIG. 4B, FIG. 5B, and FIG. 6B also show schematic cross-sectional views taken along the line AA' as shown in FIG. 1A.

As shown in FIG. 1A and FIG. 1B, a substrate 10 may be provided. In some embodiments, the substrate 10 may include fiberglass, epoxy, aluminum nitride (AlN), silicon carbide (SiC), printed circuit board (PCB), a combination thereof, or other suitable substrate, but the present disclosure is not limited thereto.

In some embodiments, the first electrode layer 20 may be formed on the substrate 10. In some embodiments, the first electrode layer 20 may include a conductive material. The conductive material may be a metal such as gold (Au), silver (Ag), copper (Cu), aluminum (Al), platinum (Pt), a metal alloy, a conductive metal oxide, the like, or other suitable material, but the present disclosure is not limited thereto. In some embodiments, the first electrode layer 20 may be a metal electrode. In some embodiments, the first electrode layer 20 may be formed on the substrate 10 by a deposition process. The deposition process may be a chemical vapor deposition (CVD) process or other suitable processes. The CVD process may be a low pressure chemical vapor deposition (LPCVD), a low temperature chemical vapor deposition (LTCVD), a rapid temperature chemical vapor deposition (RTCVD), a plasma enhanced chemical vapor deposition (PECVD), an atomic layer deposition (ALD), or other suitable CVD processes, but the present disclosure is not limited thereto.

As shown in FIG. 1A, the first electrode layer 20 may include a first electrode 20*a* and a second electrode 20*b* separated from each other. In some embodiments, the first electrode 20*a* and the second electrode 20*b* may be interdigitated electrodes corresponding to each other, but the present disclosure is not limited thereto. The first electrode 20*a* and the second electrode 20*b* may have any suitable shape, such as a linear shape, an L shape, a spiral shape, a zigzag shape, an irregular shape with a curve.

In some embodiments, one of the first electrode 20*a* and the second electrode 20*b* may be electrically connected to the subsequently formed first sensing layer (such as, the first sensing layer 26 shown in FIG. 4B), so that the one of the first electrode 20*a* and the second electrode 20*b* serves as a positive electrode. The other of the first electrode 20*a* and the second electrode 20*b* may be electrically connected to the subsequently formed first sensing layer, so that the other of the first electrode 20*a* and the second electrode 20*b* serves as a negative electrode. For example, a positive voltage may be applied to the first electrode 20*a*, so that the first electrode 20*a* may be served as the positive electrode. A negative voltage may be applied to the second electrode 20*b*, so that the second electrode 20*b* may be served as the negative electrode.

Moreover, gas species are sensed by measuring changes in electrical characteristics of the subsequently formed first sensing layer. In some embodiments, the electrical characteristics may be one-dimensional characteristics or two-dimensional characteristics. For example, the first electrode 20*a*, the second electrode 20*b*, and the first sensing layer are connected to each other to form a conductive path. Thus, the types, concentrations, or a combination thereof of the gas to be measured may be obtained by measuring the resistance difference before and after passing the gas to be measured into the sensing device. In some embodiments, the electrical characteristics may be three-dimensional characteristics. For example, when the gas to be measured includes reducing gas, the three-dimensional feature may be formed by response time, area of response, and recovery time as the three axes.

Figure 2B:
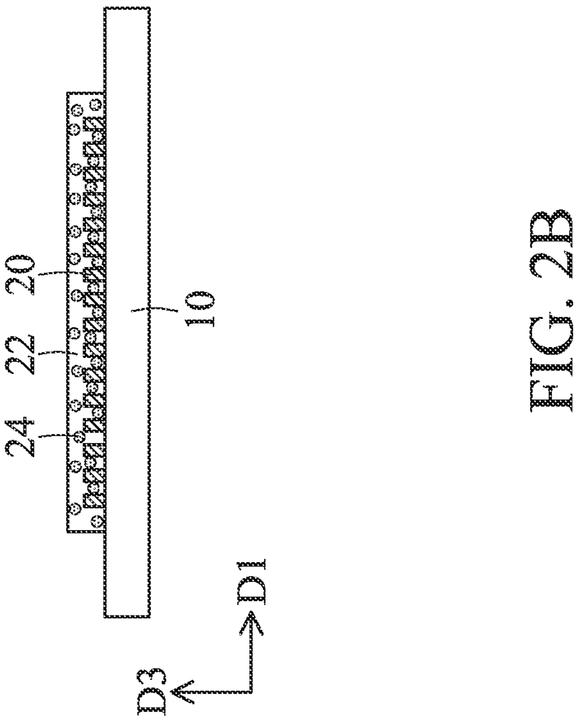
FIG. 2A and FIG. 2B are schematic top view and schematic cross-sectional view of various stages of manufacturing a sensing device according to some embodiments of the present disclosure, respectively.
Figure 2A:
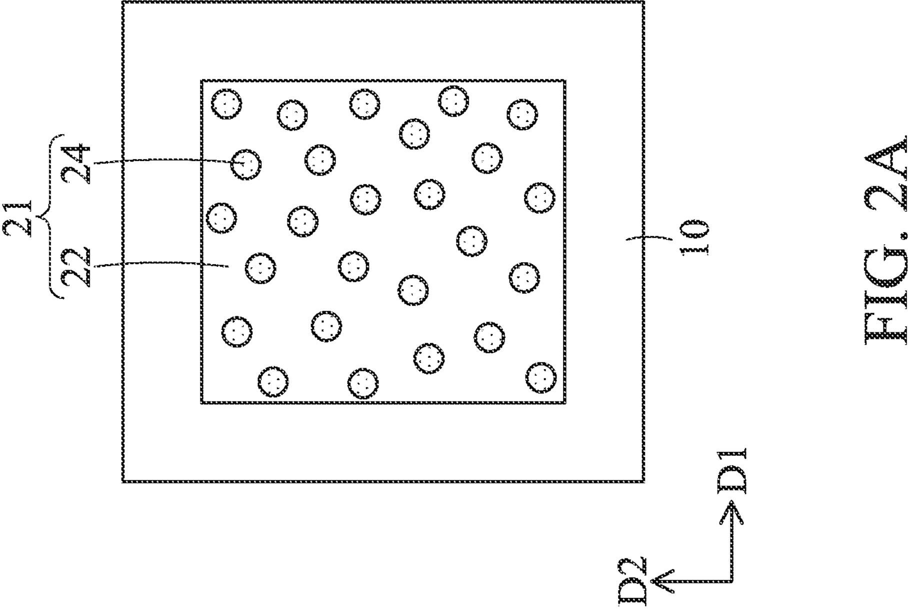

Referring to FIG. 2A and FIG. 2B, they are a schematic top view and a schematic cross-sectional view of various stages of manufacturing a sensing device according to some embodiments of the present disclosure, respectively. As shown in FIG.

2A and FIG. 2B, in some embodiments, a first mixture 21 may be provided on the first electrode layer 20. In some embodiments, the first mixture 21 may be provided on the first electrode layer 20 by a coating process, a 3D printing process, or other suitable processes, but the present disclosure is not limited thereto. In some embodiments, the first mixture 21 may cover the top surface and the side surface of the first electrode layer 20. In some embodiments, the first mixture 21 may be disposed between the first electrode 20*a* and the second electrode 20*b* of the first electrode layer 20. In some embodiments, the first mixture 21 may directly contact the first electrode 20*a* and the second electrode 20*b*.

In some embodiments, the first mixture 21 may include the first sensing material 22 and a plurality of first particles 24 dispersed in the first sensing material 22. In some embodiments, the first sensing material 22 may include metal oxide semiconductor materials, carbon-based materials, solid electrolyte materials, the like, or other suitable materials, but the present disclosure is not limited thereto. The metal oxide semiconductor may include tungsten oxide ($WO_x$), molybdenum oxide ($MoO_x$), zinc oxide (ZnO), aluminum-doped zinc oxide (Al:ZnO), nickel oxide (NiO), tin dioxide ($SnO_2$), titanium dioxide ($TiO_2$), iron oxide ($Fe_2O_3$), copper oxide (CuO), the like, or a combination thereof. The carbon-based material may include carbon black, graphene, the like, or a combination thereof. The solid electrolyte material may include, for example, yttria-stabilized zirconia (YSZ). In some embodiments, the appropriate first sensing material 22 may be selected according to the type of gas to be measured. For example, molybdenum oxide may be used to sense moisture, or the carbon-based materials, nickel oxide, and tin dioxide may be used to sense ethanol, acetone, and isopropanol.

In some embodiments, the annealing temperature of the first sensing material 22 may be greater than or equal to 300° C. and less than or equal to 800° C. For example, the annealing temperature of the first sensing material 22 may be 300° C., 350° C., 400° C., 450° C., 500° C., 550° C., 600° C., 650° C., 700° C., 750° C., 800° C., or other values or ranges of values within the aforementioned ranges, but the present disclosure is not limited thereto.

In some embodiments, the first sensing material 22 may have a viscosity greater than or equal to 1 centipoise (cP) and less than or equal to 1000 cP. For example, the viscosity of the first sensing material 22 may be 1 cP, 10 cP, 50 cP, 100 cP, 250 cP, 500 cP, 750 cP, 1000 cP, or other values or ranges of values within the aforementioned ranges, but the present disclosure is not limited thereto. In some embodiments, when the viscosity of the first sensing material 22 is less than 1 cP, the fluidity of the first sensing material 22 may be too high to be easily attached on the first electrode layer 20. When the viscosity of the first sensing material 22 is greater than 1000 cP, the fluidity of the first sensing material 22 may be too low to be uniformly disposed on the first electrode layer 20.

In some embodiments, in the third direction D3, the first sensing material 22 may have a thickness greater than or equal to 1 um and less than or equal to 50 um. In some embodiments, the first sensing material 22 may have a thickness greater than or equal to 1 um and less than or equal to 30 um. For example, the first sensing material 22 may have a thickness of 1 um, 5 um, 10 um, 15 um, 20 um, 25 um, 30 um, 35 um, 40 um, 45 um, 50um, or other values or ranges of values within the aforementioned ranges, but the present disclosure is not limited thereto. In some embodiments, when the thickness of the first sensing material 22 is less than 50 um, the sensitivity of the first sensing material 22 to the gas to be measured may be increased.

In some embodiments, the first particle 24 may include a polymer material such as polystyrene (PS). In some embodiments, the first particle 24 may be nanoparticle such as nanobead. In some embodiments, the first particle 24 may include materials that can be removed by a heat treatment process. In other words, the first particle 24 may serve as sacrificial material. In some embodiments, the first particle 24 may have a burning point. At temperatures greater than or equal to the burning point of the first particles 24, the first particle 24 may burn, so that the first particle 24 may be removed. In some embodiments, the burning point of the first particle 24 may be lower than the annealing temperature of the first sensing material 22. Accordingly, the first sensing material 22 may be further annealed during the process of removing the first particle 24 with a combustion reaction.

In other embodiments, the first particle 24 may include a thermal decomposition material, and the first particle 24 may have a thermal decomposition temperature. At temperatures greater than or equal to the thermal decomposition temperature of the first particle 24, the first particle 24 may be thermally decomposed, so that the first particle 24 may be removed. In some embodiments, the thermal decomposition temperature of the first particle 24 may be lower than the annealing temperature of the first sensing material 22. Accordingly, the first sensing material 22 may be further annealed during the process of removing the first particle 24 with a thermal decomposition reaction.

For example, when the first particle 24 is polystyrene, the burning point (or the thermal decomposition temperature) of the first particle 24 may be greater than or equal to 250° C. and less than or equal to 350° C. For example, the burning point (or the thermal decomposition temperature) of the first particle 24 may be 250° C., 270° C., 290° C., 310° C., 330° C., 350° C., or other values or ranges of values within the aforementioned ranges, but the present disclosure is not limited thereto.

In some embodiments, the diameter of the first particle 24 may be greater than or equal to 1 um and less than or equal to 100 um. For example, the diameter of the first particle 24 may be 1 um, 10 um, 25 um, 50 um, 75 um, 100 um, or other values or ranges of values within the aforementioned ranges, but the present disclosure is not limited thereto. In some embodiments, if the diameter of the first particle 24 is less than 1 um, the stacking of the first particle 24 will be unstable. If the diameter of the first particle 24 is greater than 100 um, the contact area for the gas to be measured will be insufficient, in which the contact area is formed in the process of removing the first particle 24.

In some embodiments, the volume percentage of the first particles 24 to the total volume of the first mixture 21 (the first particles 24/(total volume of the first particles 24 and the first sensing material 22)) is greater than or equal to 30% and less than or equal to 75%. For example, the volume percentage of the first particles 24 to the total volume of the first mixture 21 is 30%, 35%, 40%, 45%, 50%, 55%, 60%, 65%, 70%, 75% %, or other values or ranges of values within the aforementioned ranges, but the present disclosure is not limited thereto. For example, the volume percentage of the first particles 24 to the total volume of the first mixture 21 is less than 74%. In some embodiments, if the volume percentage of the first particles 24 to the total volume of the first mixture 21 is less than 30%, the holes in the subsequently formed first sensing layer are difficult to communicate with each other, thereby reducing the gas permeability. Wherein, the gas permeability is the ability of the gas to be measured to pass through holes in the first sensing layer. If the volume percentage of the first particles 24 to the total volume of the first mixture 21 is greater than 75%, the subsequent formed holes are excessive, so that structural strength of the subsequently formed first sensing layer may be reduced.

Figure 3B:
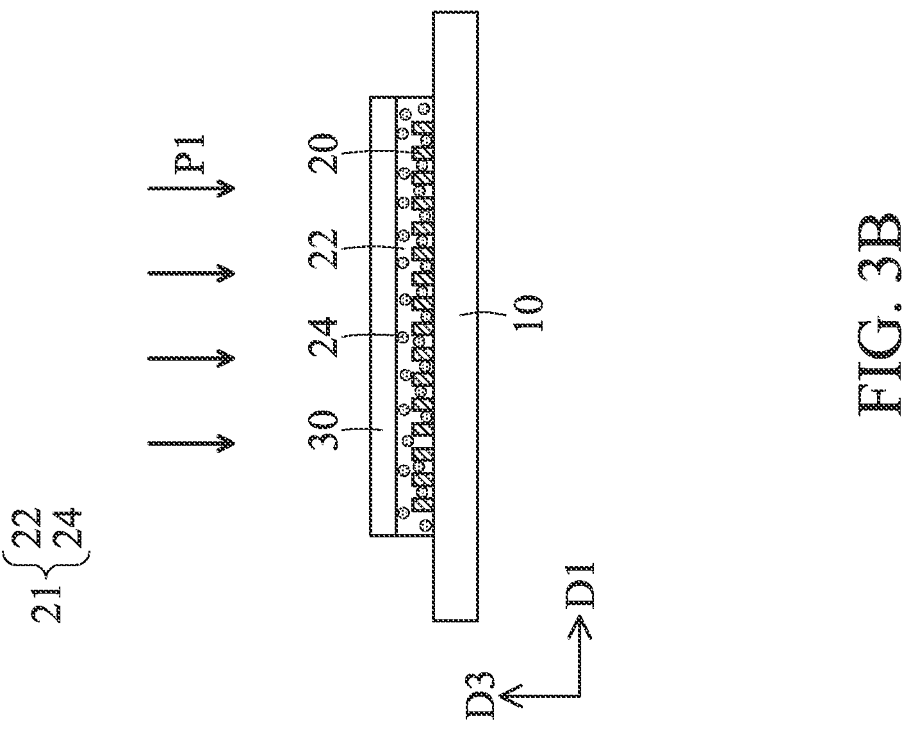
FIG. 3A and FIG. 3B are schematic top view and schematic cross-sectional view of various stages of manufacturing a sensing device according to some embodiments of the present disclosure, respectively.
Figure 3A:
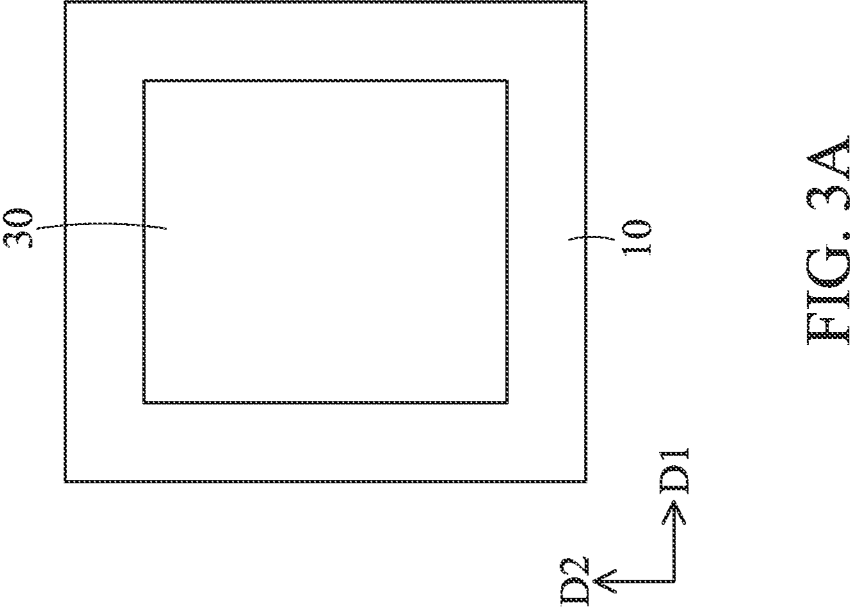

Referring to FIG. 3A and FIG. 3B, they are a schematic top view and a schematic cross-sectional view of various stages of manufacturing a sensing device according to some embodiments of the present disclosure, respectively. As shown in FIG. 3A and FIG. 3B, a first dielectric layer 30 is formed on the first mixture 21. In some embodiments, the first dielectric layer 30 may include oxides such as silicon oxide, nitrides such as silicon nitride, oxynitrides such as silicon oxynitride, other suitable dielectric materials, or a combination thereof. The present disclosure is not limited thereto. In some embodiments, the first dielectric layer 30 may include an insulating material. In some embodiments, the first dielectric layer 30 may be formed by a deposition process.

Figure 4B:
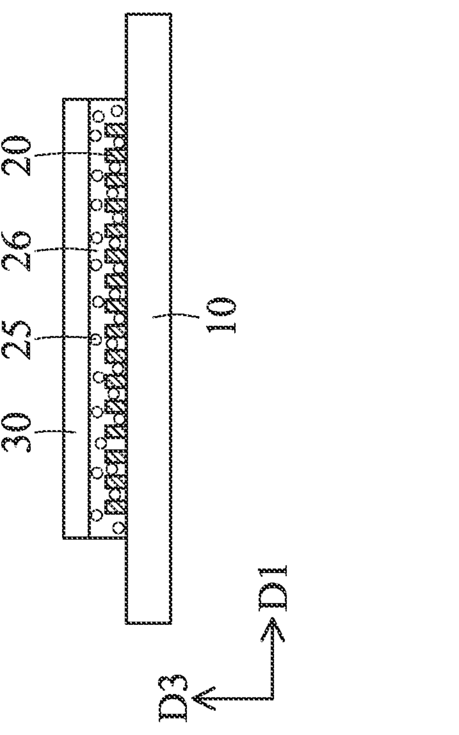
FIG. 4A and FIG. 4B are schematic top view and schematic cross-sectional view of various stages of manufacturing a sensing device according to some embodiments of the present disclosure, respectively.

As shown in FIG. 3B, in some embodiments, a first heat treatment process P1 is performed to remove the first particles 24 in the first mixture 21 and remain the first sensing material 22 in the first mixture 21, so as to form the first sensing layer 26 (as shown in FIG. 4B). In some embodiments, after the formation of the first dielectric layer 30 on the first mixture 21, the first heat treatment process P1 is performed. In other embodiments, before the formation of the first dielectric layer 30 on the first mixture 21, the first heat treatment process P1 is performed. In still other embodiments, the first heat treatment process P1 may be omitted.

In some embodiments, the temperature of the first heat treatment process P1 may be between the burning point (or the thermal decomposition temperature) of the first particles 24 and the annealing temperature of the first sensing material 22. For example, the temperature of the first heat treatment process P1 may be greater than or equal to 250° C. and less than or equal to 800° C., may be greater than or equal to 300° C. and less than or equal to 700° C., may be greater than or equal to 300° C. and less than or equal to 600° C., may be greater than or equal to 300° C. and less than or equal to 550° C., may be greater than or equal to 350° C. and less than or equal to 500° C., may be greater than or equal to 250 ° C and less than or equal to 300° C., and may be greater than or equal to 250° C. and less than or equal to 350° C., or other suitable ranges, but the present disclosure is not limited thereto.

Accordingly, performing the first heat treatment process P1 may anneal the first sensing material 22 under the condition of removing the first particles 24, thereby forming the first sensing layer. Although the first particles 24 are removed in the first heat treatment process P1, the first sensing layer not only has holes but also has sufficient structural strength because the first heat treatment process P1 is performed as an annealing process. In other embodiments, the temperature of the first heat treatment process P1 may be greater than the burning point (or the thermal decomposition temperature) of the first particle 24 to remove the first particles 24, and the annealing process of the first sensing material 22 may be omitted. In this embodiment, by controlling parameters such as the size of the first particles 24, the mixing ratio of the first particles 24 and the first sensing material 22, the first sensing layer not only has holes, but also has sufficient structural strength.

Figure 4A:
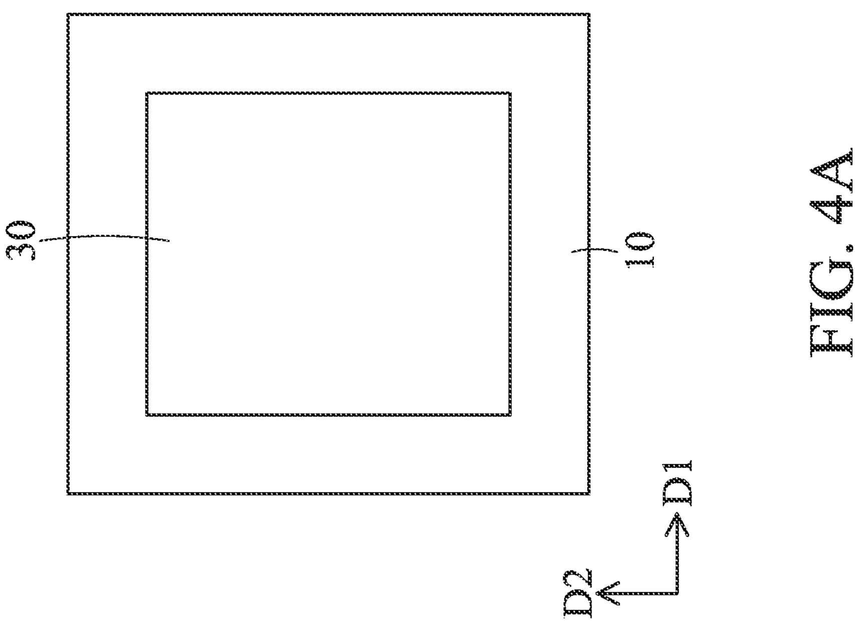

Referring to FIG. 4A and FIG. 4B, they are a schematic top view and a schematic cross-sectional view of various stages of manufacturing a sensing device according to some embodiments of the present disclosure, respectively. As shown in FIG. 4B, after performing the first heat treatment process P1, the first sensing layer 26 is formed. In some embodiments, the first dielectric layer 30 exposes the side surface of the first sensing layer 26. In some embodiments, the first sensing layer 26 may include a plurality of holes 25. As mentioned above, the plurality of holes 25 in the first sensing layer 26 are formed by the heat treatment process. In some embodiments, the first sensing layer 26 may have a hole density (or porosity) greater than or equal to 30% and less than or equal to 75%. Wherein, the hole density (or porosity) represents the ratio of the total volume of the plurality of holes 25 in the first sensing layer 26 to the total volume of the first sensing layer 26 (the total volume of the plurality of holes 25/the total volume of first sensing layer 26). For example, the hole density of the first sensing layer 26 may be 30%, 35%, 40%, 45%, 50%, 55%, 60%, 65%, 70%, 74%, 75%, or other values or ranges of values within the aforementioned ranges, but the present disclosure is not limited thereto. In some embodiments, if the hole density of the first sensing layer 26 is less than 30%, the first sensing material 22 in the first sensing layer 26 may not be in sufficient contact with the gas to be measured, thereby reducing the sensitivity. If the hole density of the first sensing layer 26 is greater than 75%, the structural strength of the first sensing layer 26 will be reduced.

In some embodiments, an electrode layer and a sensing layer together serve as a sensing unit. For example, the first electrode layer 20 and the first sensing layer 26 may function together as a first sensing unit. Then, the aforementioned steps for forming the first electrode layer 20 and for forming the first sensing layer 26 may be repeated to form other sensing units on the first sensing unit. For example, the second electrode layer may be formed on the first sensing layer 26, and then the second sensing layer may be formed on the second electrode layer with the second mixture. Therefore, the second electrode layer and the second sensing layer may function together as a second sensing unit. In some embodiments, the first sensing unit and the second sensing unit may be used to sense different gases. In some embodiments, the second particles in the second mixture may be omitted to form a second sensing layer substantially free of holes. In some embodiments, dielectric layers may be formed between different sensing units, so that different sensing units are insulated from each other by the dielectric layer. Hereinafter, other sensing units formed subsequently will be described.

Figure 5B:
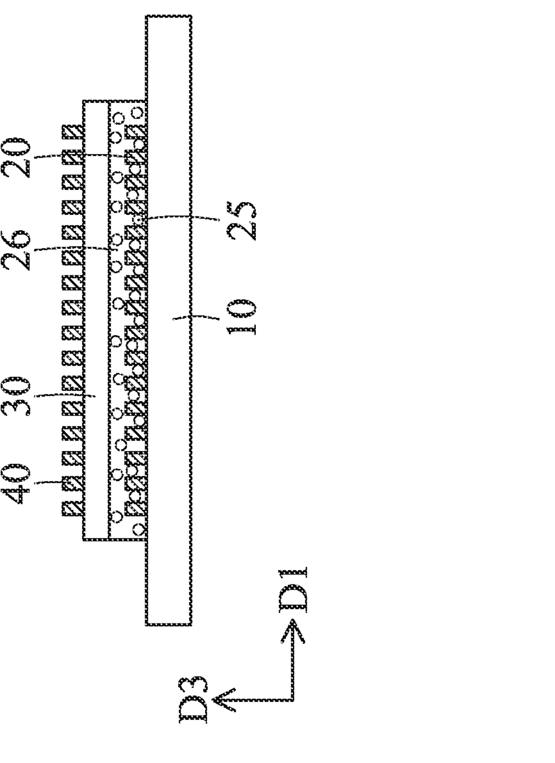
FIG. 5A and FIG. 5B are schematic top view and schematic cross-sectional view of various stages of manufacturing a sensing device according to some embodiments of the present disclosure, respectively.
Figure 5A:
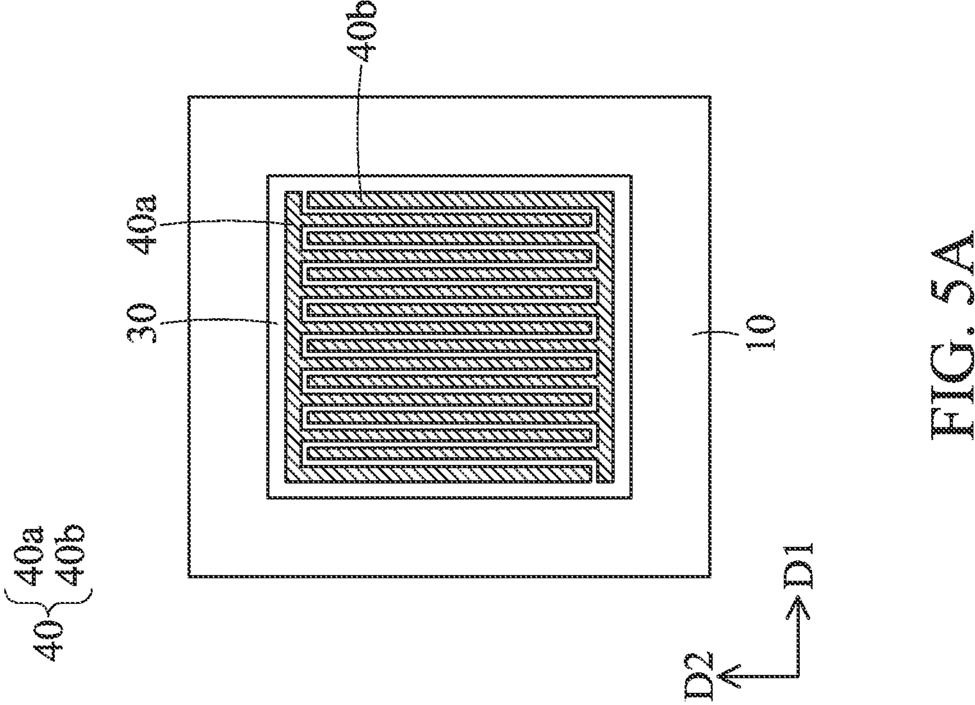

Referring to FIG. 5A and FIG. 5B, they are a schematic top view and a schematic cross-sectional view of various stages of manufacturing a sensing device according to some embodiments of the present disclosure, respectively. As shown in FIG. 5A and FIG. 5B, the second electrode layer 40 is formed on the first dielectric layer 30. In some embodiments, the second electrode layer 40 may include a third electrode 40*a* and a fourth electrode 40*b* separated from each other. In some embodiments, the material and formation method of the second electrode layer 40 may be the same as or different from those of the first electrode layer 20. In some embodiments, the shapes of the second electrode layer 40 and the first electrode layer 20 may be the same or different. In some embodiments, the first electrode layer 20 and the second electrode layer 40 may be connected by side wires (not shown) along the third direction D3. In some embodiments, the third electrode 40*a* may be a positive electrode, and the fourth electrode 40*b* may be a negative electrode. For example, the first electrode 20*a* may be electrically connected with the third electrode 40*a*, and the second electrode 20*b* may be electrically connected with the fourth electrode 40b.

Figure 6B:
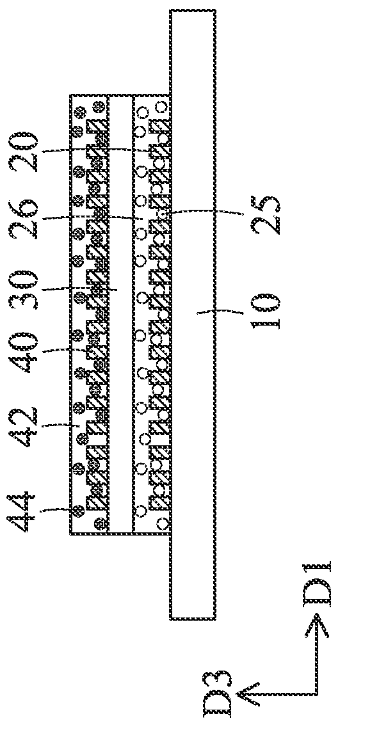
FIG. 6A and FIG. 6B are schematic top view and schematic cross-sectional view of various stages of manufacturing a sensing device according to some embodiments of the present disclosure, respectively.
Figure 6A:
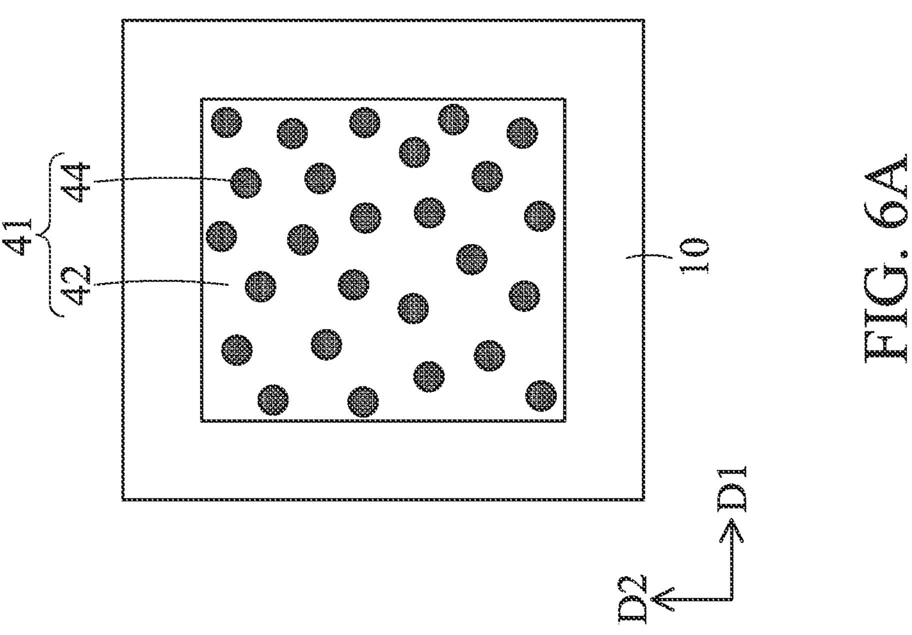

Referring to FIG. 6A and FIG. 6B, they are a schematic top view and a schematic cross-sectional view of various stages of manufacturing a sensing device according to some embodiments of the present disclosure, respectively. As shown in FIG. 6A and FIG. 6B, the second mixture 41 may be provided on the second electrode layer 40 and the first dielectric layer 30. In some embodiments, the second mixture 41 may be provided on the second electrode layer 40 and the first dielectric layer 30 by a coating process, a 3D printing process, or other suitable processes, but the present disclosure is not limited thereto. In some embodiments, the second mixture 41 may cover the top surface and the side surface of the second electrode layer 40. The second mixture 41 may be disposed between the third electrode 40*a* and the fourth electrode 40*b* of the second electrode layer 40. The second mixture 41 may be in direct contact with the third electrode 40*a* and the fourth electrode 40*b*.

In some embodiments, the second mixture 41 may include the second sensing material 42 and a plurality of second particles 44 dispersed in the second sensing material 42. In some embodiments, the second sensing material 42 and the first sensing material 22 may be the same or different, and the second particles 44 and the first particles 24 may be the same or different. In other embodiments, the second particle 44 may be omitted to form the second sensing layer substantially without holes. In some embodiments, the second sensing material 42 and the first sensing material 22 may be different, so that the formed first sensing layer 26 and the second sensing layer may be used to sense different gases.

Figure 7B:
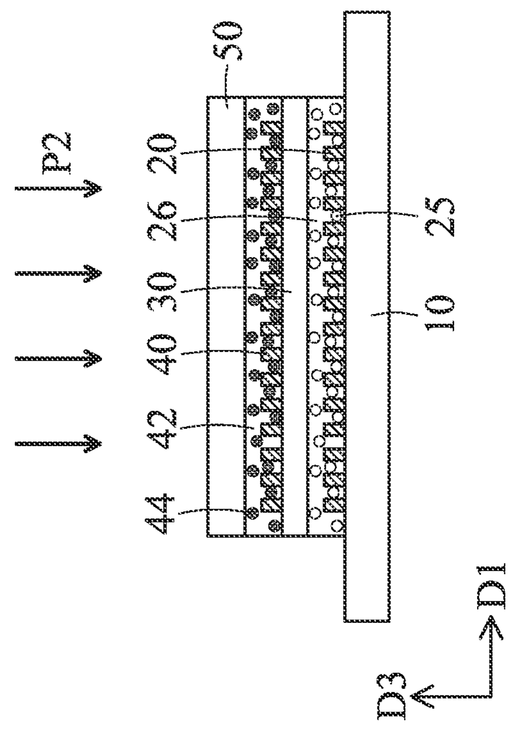
FIG. 7A and FIG. 7B are schematic top view and schematic cross-sectional view of various stages of manufacturing a sensing device according to some embodiments of the present disclosure, respectively.
Figure 7A:
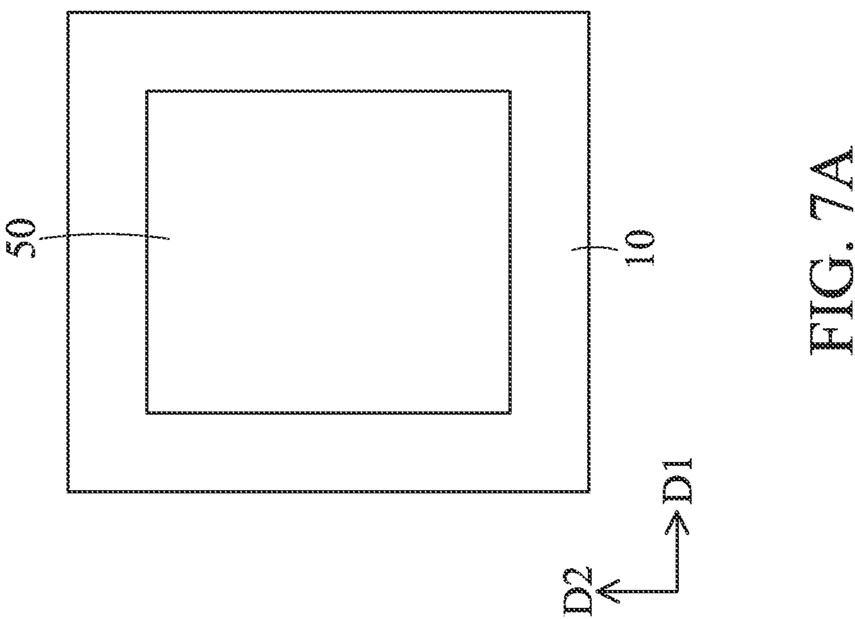

Referring to FIG. 7A and FIG. 7B, they are a schematic top view and a schematic cross-sectional view of various stages of manufacturing a sensing device according to some embodiments of the present disclosure, respectively. As shown in FIG. 7A and FIG. 7B, a second dielectric layer 50 is formed on the second mixture 41. In some embodiments, the material and formation method of the second dielectric layer 50 may be the same as or different from those of the first dielectric layer 30.

Figure 8:
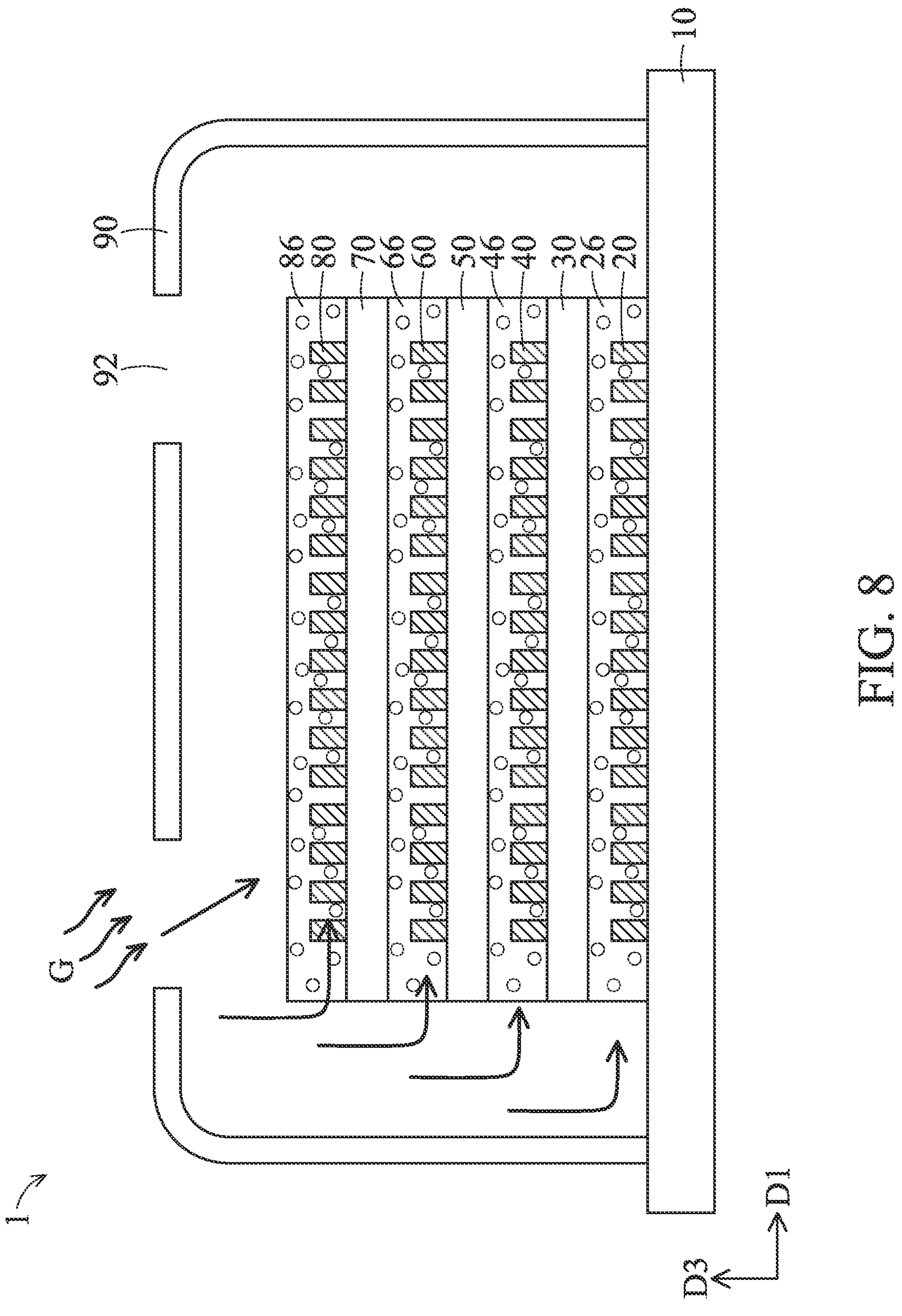
FIG. 8 to FIG. 10 are schematic cross-sectional views of sensing devices according to some embodiments of the present disclosure.

As shown in FIG. 7B, in some embodiments, the second heat treatment process P2 is performed to remove the second particles 44 in the second mixture 41 and remain the second sensing material 42 in the second mixture 41, so as to form the second sensing layer 46 (as shown in FIG. 8). In some embodiments, the second dielectric layer 50 exposes the side surface of the second sensing layer 46. In some embodiments, the temperature of the second heat treatment process P2 may be between the burning point (or the thermal decomposition temperature) of the second particles 44 and the annealing temperature of the second sensing material 42.

In some embodiments, after the formation of the second dielectric layer 50 on the second mixture 41, the second heat treatment process P2 is performed. In other embodiments, before the formation of the second dielectric layer 50 on the second mixture 41, the second heat treatment process P2 is performed. In some other embodiments, the first heat treatment process P1 may be omitted, and the second heat treatment process P2 is performed, so as to remove the second particles 44 in the second mixture 41 and the first particles 24 in the first mixture 21 using the second heat treatment process P2. In this embodiment, the temperature of the second heat treatment process P2 may be greater than the burning point (or the thermal decomposition temperature) of the first particles 24 and the burning point (or the thermal decomposition temperature) of the second particles 44. In some other embodiments, when the second mixture 41 substantially does not include the second particles 44, the second heat treatment process P2 may be performed to form the second sensing layer 46 and anneal the second sensing layer 46. In this embodiment, the temperature of the second heat treatment process P2 may be the annealing temperature of the second sensing layer 46.

Referring to FIG. 8, it is a schematic cross-sectional view of a sensing device 1 according to some embodiments of the present disclosure. As shown in FIG. 8, in some embodiments, the abovementioned steps are repeated to form the third electrode layer 60 on the second dielectric layer 50, form the third sensing layer 66 on the third electrode layer 60, and formed the third dielectric layer 70 on the third sensing layer 66. Moreover, the fourth electrode layer 80 is formed on the third dielectric layer 70, and the fourth sensing layer 86 is formed on the fourth electrode layer 80. In some embodiments, the materials and formation methods of the third electrode layer 60 and the fourth electrode layer 80 may be the same as or different from those of the first electrode layer 20. The materials and formation methods of the third sensing layer 66 and the fourth sensing layer 86 may be the same as or different from those of the first sensing layer 26 and the second sensing layer 46. The material and formation method of the third dielectric layer 70 may be the same as or different from those of the first dielectric layer 30. It should be noted that the sensing device 1 may include any number of sensing units. For example, the sensing device 1 may include 2, 3, 4 (as shown in FIG. 8), 5, 6, 7, 8, 9, 10, 15, 20, or other suitable values of sensing units.

As shown in FIG. 8, in some embodiments, a capping layer 90 is formed on the substrate 10 to obtain the sensing device 1. In some embodiments, the capping layer 90 may surround the first electrode layer 20 to the fourth electrode layer 80, the first sensing layer 26 to the fourth sensing layer 86, and the first dielectric layer 30 to the third dielectric layer 70. In some embodiments, the capping layer 90 may be used to prevent the sensing device 1 from being damaged by an external force impacting the sensing device 1, so the capping layer 90 may be used as a protective layer of the sensing device 1. In some embodiments, the capping layer 90 may have an opening 92, so that the gas G to be measured passes through the opening 92 and contacts the first sensing layer 26 to the fourth sensing layer 86.

In some embodiments, in the sensing device 1, two adjacent sensing layers may overlap in the normal direction (i.e., the third direction D3) of the substrate 10. For example, the first sensing layer 26 and the second sensing layer 46 overlap in the normal direction (i.e., the third direction D3) of the substrate 10. Accordingly, the device area of the sensing device 1 may be reduced.

In some embodiments, in the sensing device 1, the sensing layer farther from the substrate 10 in the two adjacent sensing layers is referred as the upper sensing layer, and the sensing layer closer to the substrate 10 in the two adjacent sensing layers is referred as the lower sensing layer. In some embodiments, in the sensing device 1, the area of the upper sensing layer may be greater than or equal to 50% of the area of the lower sensing layer. For example, the first sensing layer 26 and the second sensing layer 46 are adjacent. Compared with the first sensing layer 26, the second sensing layer 26 is farther away from the substrate 10. Therefore, the area of the second sensing layer 46 may be greater than or equal to 50% of the area of the first sensing layer 26. For example, the area of the second sensing layer 46 may be 50%, 60%, 70%, 80%, 90%, 95%, 100% of the area of the first sensing layer 26, or other values or ranges of values within the aforementioned ranges, but the present disclosure is not limited thereto. If the area of the upper sensing layer is less than 50% of the area of the lower sensing layer, the sensing area of the upper sensing layer may be insufficient. In some embodiments, the projected area of the second sensing layer 46 on the substrate 10 may be smaller than or equal to the projected area of the first sensing layer 26 on the substrate 10. In some embodiments, the projection of the second sensing layer 46 on the substrate 10 is within the projection of the first sensing layer 26 on the substrate 10.

In some embodiments, in the sensing device 1, the upper sensing layer may expose a portion of the top surface of the lower sensing layer. For example, the second sensing layer 46 may expose a portion of the top surface of the first sensing layer 26. Accordingly, the area of the upper sensing layer may be smaller than the area of the lower sensing layer, so that the exposed surface of the lower sensing layer is further in contact with the gas G to be measured. Therefore, the contact area between the gas G to be measured and the lower sensing layer is increased. In other words, each sensing layer in the sensing device 1 may effectively sense and the device area of the sensing device 1 may be reduced.

In some embodiments, in the sensing device 1, the hole density of the lower sensing layer may be greater than or equal to the hole density of the upper sensing layer. For example, the first sensing layer 26 and the second sensing layer 46 are adjacent.

Compared with the second sensing layer 46, the first sensing layer 26 is closer to the substrate 10. Therefore, the hole density of the first sensing layer 26 may be greater than or equal to the hole density of the second sensing layer 46. For example, the difference between the hole density of the upper sensing layer and the lower sensing layer (|hole density of the upper sensing layer-hole density of the lower sensing layer|) may be 0, 10%, 20%, 30%, 40%, or other values or ranges of values within the aforementioned ranges, but the present disclosure is not limited thereto. Accordingly, the hole density of the lower sensing layer may be greater than the hole density of the upper sensing layer, so that the gas G to be measured may contact the lower sensing layer. In other words, each sensing layer in the sensing device 1 may effectively sense and the device area of the sensing device 1 may be reduced.

In some embodiments, in the sensing device 1, each sensing layer may include different sensing materials to sense different gases. For example, the second sensing layer 46 may be disposed between the first sensing layer 26 and the third sensing layer 66, and the materials of the third sensing layer 66, the second sensing layer 46, and the first sensing layer 26 are different from each other. In some embodiments, in the sensing device 1, the first sensing layer 26 may be used for sensing ammonia, the second sensing layer 46 and the third sensing layer 66 may be used for sensing organic gas, and the fourth sensing layer 86 may be used to sense water vapor. In some embodiments, in the sensing device 1, the first sensing layer 26 may include molybdenum oxide, the second sensing layer 46 may include carbon black, the third sensing layer 66 may include nickel oxide, and the fourth sensing layer 86 may include tin dioxide for sensing moisture, ethanol, acetone, and isopropanol.

Hereinafter, the same or similar elements are denoted by the same or similar reference numerals, and repeated descriptions are omitted.

Figure 9:
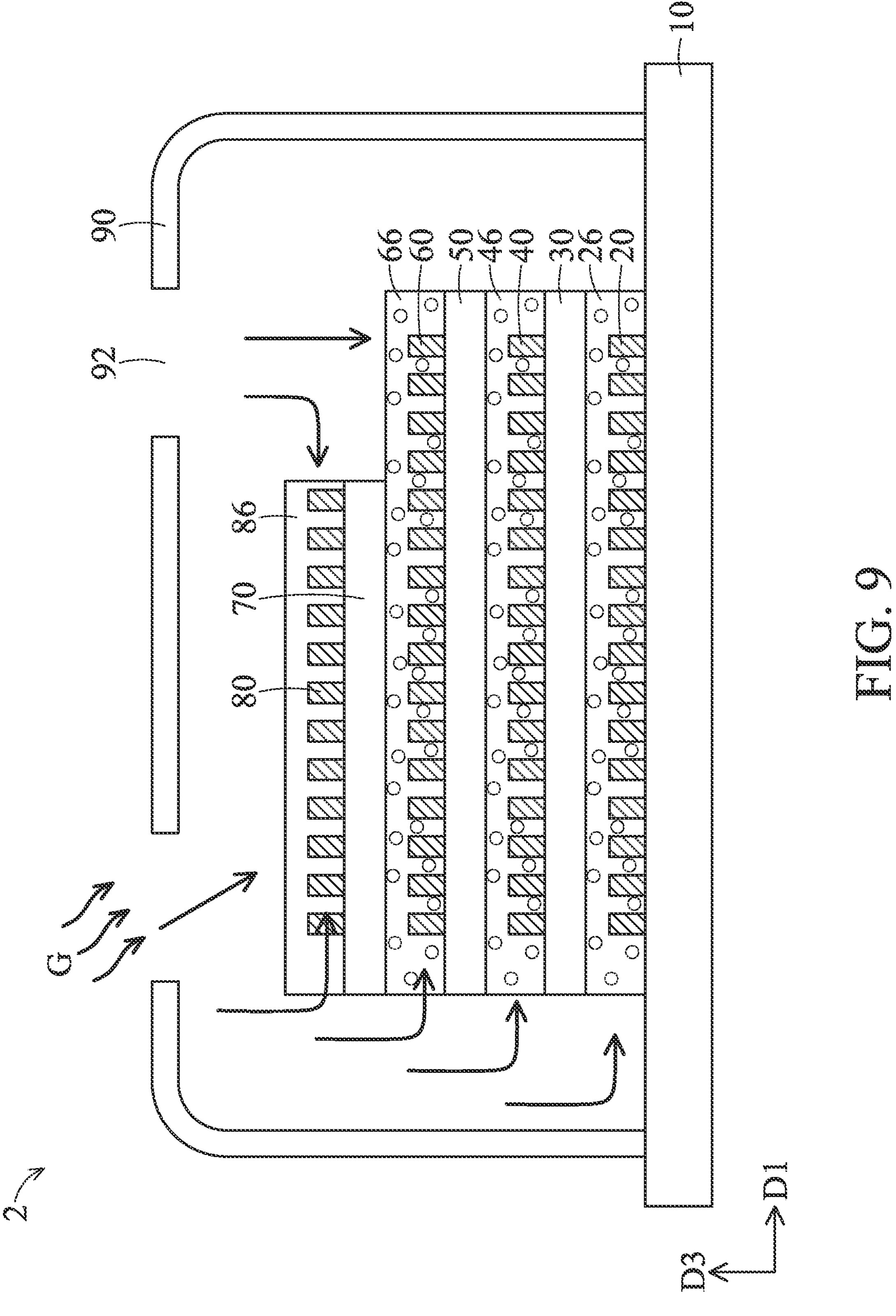

Referring to FIG. 9, it is a schematic cross-sectional view of a sensing device 2 according to some embodiments of the present disclosure. As shown in FIG. 9, in some embodiments, in the sensing device 2, the fourth sensing layer 86 may have substantially free of holes. Thus, the hole density of the fourth sensing layer 86 may be substantially zero. Since the top surface of the fourth sensing layer 86 may directly contact the gas G to be measured, the area of the fourth sensing layer 86 may be reduced, and a portion of the top surface of the third sensing layer 66 may be exposed by the fourth sensing layer 86. Thus, the contact area between the third sensing layer 66 and the gas G to be measured may be increased. In some embodiments, the area of the fourth sensing layer 86 is 70% of the area of the third sensing layer 66, and the difference between the hole density of the fourth sensing layer 86 and the hole density of the third sensing layer 66 is 30%. In some embodiments, the hole density of the third sensing layer 66 may be 30%, the hole density of the second sensing layer 46 may be 70%, and the hole density of the first sensing layer 26 may be 70%. In other words, the hole density of the first sensing layer 26 may be substantially the same as that of the second sensing layer 46, and the hole density of the first sensing layer 26 may be greater than that of the third sensing layer 66. The hole density of the third sensing layer 66 may be greater than the hole density of the fourth sensing layer 86.

Figure 10:
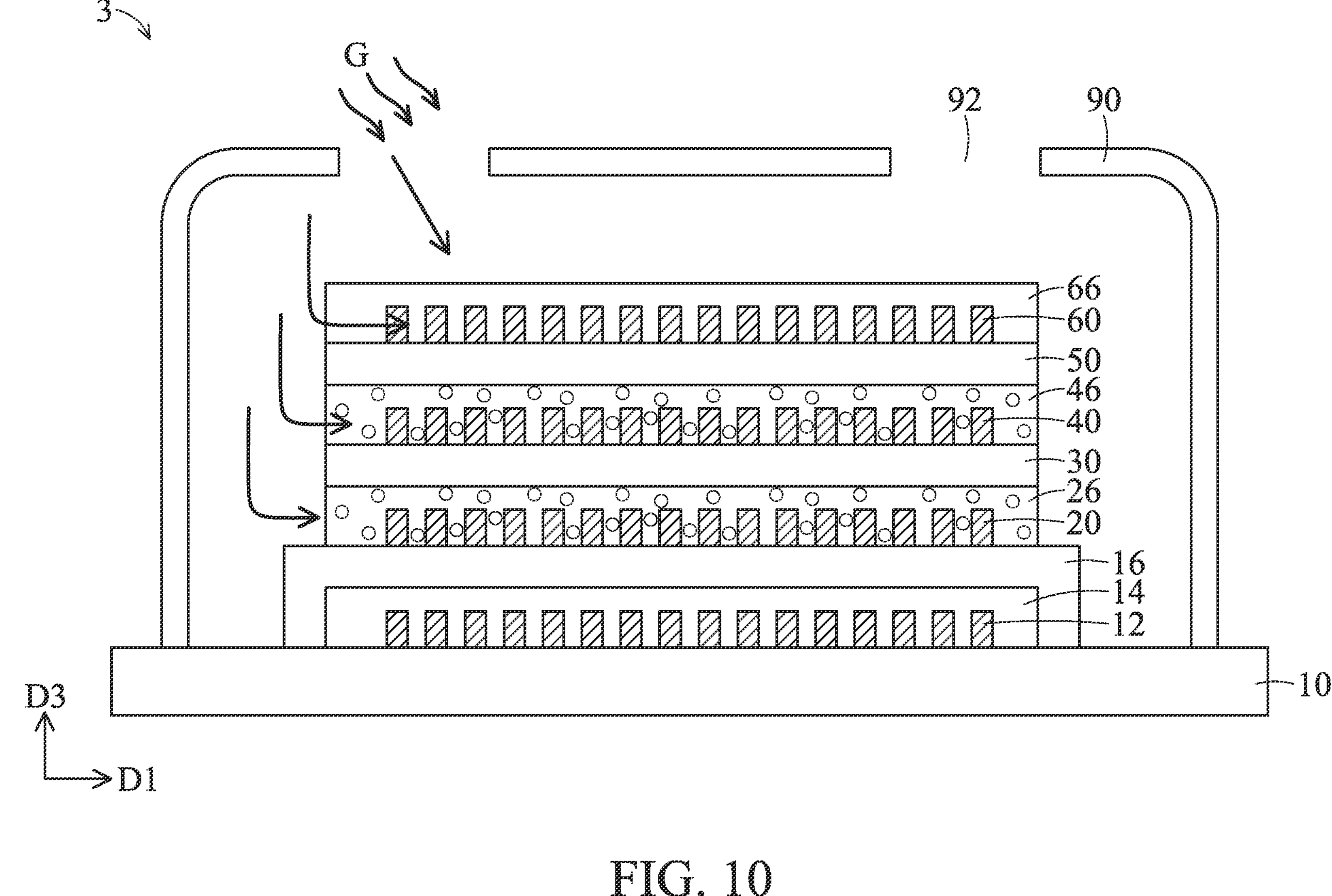

Referring to FIG. 10, it is a schematic cross-sectional view of a sensing device 3 according to some embodiments of the present disclosure. As shown in FIG. 10, in some embodiments, the sensing device 3 may include a base electrode layer 12, a base sensing layer 14, and a base dielectric layer 16. In some embodiments, the base electrode layer 12 may be disposed on the substrate 10. The base sensing layer 14 may be disposed on the base electrode layer 12 and the substrate 10. The base dielectric layer 16 may be disposed on the side surface and the top surface of the base sensing layer 14. Therefore, the first sensing layer 26 may be disposed between the base sensing layer 14 and the second sensing layer 46. In some embodiments, the base dielectric layer 16 and the substrate 10 may surround the base sensing layer 14 to enclose the base sensing layer 14. Therefore, the gas G to be measured and the base sensing layer 14 are isolated by the base dielectric layer 16, so that the gas G to be measured and the base sensing layer 14 cannot contact each other. In some embodiments, the material and formation method of the base electrode layer 12 may be the same as or different from those of the first electrode layer 20. The material and formation method of the base sensing layer 14 may be the same as or different from those of the first sensing layer 26 or the second sensing layer 46. The material and formation method of the base dielectric layer 16 may be the same as or different from the material and formation method of the first dielectric layer 30.

In some embodiments, the base sensing layer 14 may be made of the same material as the first sensing layer 26, the second sensing layer 46, or the third sensing layer 66, so as to serve as the conjugate layer of the first sensing layer 26, the second sensing layer 46, or the third sensing layer 66. In some embodiments, when the material of the base sensing layer 14 and the first sensing layer 26 are the same, the base sensing layer 14 may provide electrical characteristic in which the first sensing material 22 in the first sensing layer 26 does not contact the gas G to be measured. Thus, the base sensing layer 14 is used as the baseline of the first sensing layer 26. In this embodiment, the hole density of the first sensing layer 26 may be 70%, the hole density of the base sensing layer 14 may be 70% (not shown), the hole density of the second sensing layer 46 may be 70%, and the hole density of the third sensing layer 66 may be zero. In other words, the hole density of the first sensing layer 26 may be substantially the same as that of the base sensing layer 14, the hole density of the first sensing layer 26 may be substantially the same as that of the second sensing layer 46, and the hole density of the first sensing layer 26 may be greater than that of the third sensing layer 66.

In some other embodiments, when the materials of the base sensing layer 14 and the third sensing layer 66 are the same, the hole densities of the base sensing layer 14 and the third sensing layer 66 may both be zero, the hole density of the second sensing layer 46 may be 70%, and the hole density of the first sensing layer 26 may be 70%. In other words, the hole density of the first sensing layer 26 may be substantially the same as that of the second sensing layer 46, and the hole density of the first sensing layer 26 may be greater than that of the third sensing layer 66.

In summary, according to some embodiments of the present disclosure, the present disclosure provides a vertically stacked sensing device by disposing the first sensing layer having a plurality of holes and the second sensing layer in the vertical direction. In the present disclosure, the sensing device is miniaturized by removing particles (for example, the first particles) to form a plurality of holes. Furthermore, the present disclosure controls the sensing characteristics of the sensing device by adjusting the particle diameter, hole density, area ratio, and/or stacking method of each sensing layer. Accordingly, the present disclosure provides improved sensing devices and methods of manufacturing the same.

Although some embodiments of the present disclosure and their advantages have been disclosed above, it should be understood that a person of ordinary skill in the art may change, replace and/or modify the present disclosure without departing from the spirit and scope of the present disclosure. The features between the embodiments of the present disclosure may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future process, machine, manufacturing, material composition, device, method, and step from the content disclosed in the present disclosure, as long as the current or future process, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. The scope of the present disclosure should be determined by the scope of the claims. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A sensing device, comprising:

a substrate;

a first electrode layer disposed on the substrate;

a first sensing layer disposed on the first electrode layer and having a plurality of holes;

a first dielectric layer disposed on the first sensing layer;

a second electrode layer disposed on the first dielectric layer;

a second sensing layer disposed on the second electrode layer, wherein a material of the second sensing layer is different from a material of the first sensing layer;

a second dielectric layer disposed on the second sensing layer; and a capping layer disposed on the substrate, wherein the first dielectric layer is in direct contact with each of the first sensing layer and the second sensing layer.

2. The sensing device as claimed in claim 1, wherein the second sensing layer has a plurality of holes.

3. The sensing device as claimed in claim 2, wherein a hole density of the first sensing layer is greater than a hole density of the second sensing layer.

4. The sensing device as claimed in claim 1, wherein a diameter of one of the plurality of holes is greater than or equal to 1 um and less than or equal to 100 um.

5. The sensing device as claimed in claim 1, wherein the second sensing layer exposes a portion of a top surface of the first sensing layer.

6. The sensing device as claimed in claim 5, wherein an area of the second sensing layer is greater than or equal to 50% of an area of the first sensing layer.

7. The sensing device as claimed in claim 1, wherein the first dielectric layer exposes a side surface of the first sensing layer.

8. The sensing device as claimed in claim 1, wherein the second dielectric layer exposes a side surface of the second sensing layer.

9. The sensing device as claimed in claim 1, further comprising:

a base electrode layer disposed on the substrate;

a base sensing layer disposed on the base electrode layer; and a base dielectric layer disposed on a side surface and a top surface of the base sensing layer, wherein the base dielectric layer and the substrate surround the base sensing layer;

wherein the first sensing layer is disposed between the base sensing layer and the second sensing layer.

10. The sensing device as claimed in claim 9, wherein a material of the base sensing layer is the same as the material of the first sensing layer or the material of the second sensing layer.

11. The sensing device as claimed in claim 1, further comprising:

a third electrode layer disposed on the second dielectric layer;

a third sensing layer disposed on the third electrode layer, wherein a material of the third sensing layer is different from the material of the first sensing layer and the material of the second sensing layer; and a third dielectric layer disposed on the third sensing layer.

12. The sensing device as claimed in claim 11, wherein the second sensing layer is disposed between the first sensing layer and the third sensing layer.

13. A method of manufacturing a sensing device, comprising:

providing a substrate;

forming a first electrode layer on the substrate;

providing a first mixture on the first electrode layer, wherein the first mixture comprises:

a first sensing material; and first particles dispersed in the first sensing material;

forming a first dielectric layer on the first mixture;

performing a first heat treatment process to remove the first particles in the first mixture so as to form a first sensing layer;

forming a second electrode layer on the first dielectric layer;

forming a second sensing layer on the second electrode layer;

forming a second dielectric layer on the second sensing layer; and forming a capping layer on the substrate, wherein the first dielectric layer is in direct contact with each of the first sensing layer and the second sensing layer.

14. The manufacturing method as claimed in claim 13, wherein a temperature of the first heat treatment process is between a burning point of the first particles and an annealing temperature of the first sensing material.

15. The manufacturing method as claimed in claim 13, wherein after the formation of the first dielectric layer on the first mixture, a first heat treatment process is performed.

16. The manufacturing method as claimed in claim 13, wherein a volume percentage of the first particles to a total volume of the first mixture is greater than or equal to 30% and less than or equal to 75%.

17. The manufacturing method as claimed in claim 13, wherein a diameter of the first particles is greater than or equal to 1 um and less than or equal to 100 um.

18. The manufacturing method as claimed in claim 13, wherein the formation of the second sensing layer on the second electrode layer further comprises:

providing a second mixture on the second electrode layer, wherein the second mixture comprises:

a second sensing material; and second particles dispersed in the second sensing material; and performing a second heat treatment process to remove the second particles in the second mixture so as to form the second sensing layer.

19. The manufacturing method as claimed in claim 18, wherein a temperature of the second heat treatment process is between a burning point of the second particles and an annealing temperature of the second sensing material.

20. The manufacturing method as claimed in claim 18, wherein the first sensing material is different from the second sensing material.

* * * * *